(12) United States Patent
Davis

(10) Patent No.: US 7,791,200 B2
(45) Date of Patent: Sep. 7, 2010

(54) APPROACH TO HIGH TEMPERATURE WAFER PROCESSING

(75) Inventor: Richard A. Davis, Plano, TX (US)

(73) Assignee: Honeywell International Inc., Morristown, NJ (US)

( * ) Notice: Subject to any disclaimer, the term of this patent is extended or adjusted under 35 U.S.C. 154(b) by 133 days.

(21) Appl. No.: 12/055,823

(22) Filed: Mar. 26, 2008

(65) Prior Publication Data

US 2009/0243107 A1   Oct. 1, 2009

Related U.S. Application Data

(62) Division of application No. 11/208,178, filed on Aug. 19, 2005, now Pat. No. 7,531,426.

(51) Int. Cl.
*H01L 21/46* (2006.01)
*H01L 23/485* (2006.01)
(52) U.S. Cl. ............... 257/753; 257/E23.019; 257/E23.023; 257/E21.519; 438/455
(58) Field of Classification Search .......... 257/753, 257/E23.019; 438/455
See application file for complete search history.

(56) References Cited

U.S. PATENT DOCUMENTS

| 4,842,686 | A | 6/1989 | Davis et al. |
| 5,311,404 | A | 5/1994 | Trask et al. |
| 5,821,620 | A | 10/1998 | Hong |
| 6,207,473 | B1 | 3/2001 | Hirai et al. |
| 6,284,669 | B1 | 9/2001 | Erdeljac et al. |
| 6,337,030 | B1 | 1/2002 | Sakaguchi |
| 6,475,896 | B1 | 11/2002 | Hashimoto |
| 6,586,340 | B2 | 7/2003 | Lee et al. |
| 6,677,167 | B2 | 1/2004 | Kanno et al. |
| 6,767,840 | B1 | 7/2004 | Uehara et al. |
| 6,837,974 | B2 | 1/2005 | Lawson et al. |
| 6,849,555 | B2 | 2/2005 | Lee et al. |
| 7,396,740 | B2 | 7/2008 | Bakke et al. |
| 2003/0080431 | A1 | 5/2003 | Uzoh et al. |
| 2003/0089868 | A1 | 5/2003 | Ito et al. |
| 2003/0170966 | A1 | 9/2003 | Lutz |
| 2004/0040933 | A1 | 3/2004 | Kanno et al. |
| 2004/0045813 | A1 | 3/2004 | Kanno et al. |
| 2005/0118823 | A1 | 6/2005 | Kawashima |
| 2005/0277230 | A1 | 12/2005 | Brintzinger et al. |
| 2007/0042592 | A1* | 2/2007 | Davis .................. 438/612 |
| 2008/0136000 | A1 | 6/2008 | Fischer et al. |

* cited by examiner

*Primary Examiner*—Evan Pert
*Assistant Examiner*—Krista A Soderholm

(57) ABSTRACT

At temperatures near, and above, 385° C., gold can diffuse into silicon and into some contact materials. Gold, however, is an excellent material because it is corrosion resistant, electrically conductive, and highly reliable. Using an adhesion layer and removing gold from the contact area above and around a contact allows a Micro-Electro-Mechanical Systems device or semiconductor to be subjected to temperatures above 385° C. without risking gold diffusion. Removing the risk of gold diffusion allows further elevated temperature processing. Bonding a device substrate to a carrier substrate can be an elevated temperature process.

19 Claims, 4 Drawing Sheets

APPROACH TO HIGH TEMPERATURE WAFER PROCESSING

CROSS REFERENCE TO RELATED APPLICATIONS

This patent application is a divisional application of U.S. patent application Ser. No. 11/208,178 filed Aug. 19, 2005 now U.S. Pat. No. 7,531,426 entitled "Novel approach to high temperature wafer processing" and to international application PCT/US06/32289 filed Aug. 18, 2006 titled "A NOVEL APPROACH FOR HIGH TEMPERATURE WAFER PROCESSING.

TECHNICAL FIELD

Embodiments relate to the fields of semiconductor processing, sensors, and Micro-Electro-Mechanical Systems (MEMS). Embodiments also relate producing gold pads that can withstand high temperatures such as those encountered in bonding operations wherein a device substrate is bonded to a carrier substrate.

BACKGROUND

Microstructure products, such as pressure sensors, can be produced via semiconductor wafer processing or MEMS processing, hereafter referred to as MEMS processing. The microstructure product can be fabricated on a device substrate using current and well known MEMS processing techniques. A further step that is often required is bonding the device substrate to a handler substrate. Furthermore, gold pads or gold interconnect schemes are often used because of gold's high reliability and low corrosion characteristics. Gold and silicon, however, have a eutectic melting point of about 377-385° C. and bonding operations often exceed that temperature.

Techniques known to those practiced in the art of wafer processing can be used to fabricate a device on a device substrate. MEMS processing is a stepwise process with one step following another. One of the last steps is contact formation.

FIG. 4, labeled as "prior art", illustrates a device substrate 101 with a passivation layer 103 and a contact 102. The passivation layer 103 is often a layer of silicon dioxide, often simply called "oxide". The passivation layer 103 can also be silicon nitride, often simply called "nitride". The contact 102 is an electrical contact, which is a part of a microcircuit or MEMS device where electrical current or electrical voltage is applied. FIG. 4 does not show a MEMS device element or any microcircuit element other than the contact 102. Those practiced in the art of MEMS are familiar with the processing steps leading up to and including contact formation. Furthermore, they are aware of the vast variety of devices and circuits that are typically present on a device substrate that has a contact 102. The contact 102 can consist of platinum silicide (PtSi) as an example of a typical contact material.

FIG. 5, labeled as "prior art", illustrates a device substrate 101 with a contact 102, passivation layer 103, and an adhesion layer 104. The structure illustrated in FIG. 5 can be produced from that of FIG. 4 by depositing a layer of material to form the adhesion layer. Those practiced in the art of MEMS know many ways to deposit a layer of material over a substrate. The adhesion layer 104 can consist of titanium tungsten (TiW) or a similar material.

FIG. 6, labeled as "prior art", illustrates a device substrate 101 with a contact 102, passivation layer 103, adhesion layer 104, and gold layer 105. The structure illustrated in FIG. 6 can be produced from that of FIG. 5 by depositing a layer of gold over the adhesion layer.

FIG. 7, labeled as "prior art", illustrates a device substrate 101 with a contact 102, passivation layer 103, adhesion layer 104, and gold layer 105 after patterning. The structure of FIG. 7 can be formed from that of FIG. 6 by patterning the adhesion layer 104 and the gold layer 105. The fact that the gold layer 105 does not completely cover the adhesion layer 104 is a standard part of MEMS processing that is not special, but should be noted.

Structures similar to that illustrated in FIG. 7 are produced on device substrates in order to take advantage of the properties of the gold layer. After patterning, however, the gold layer 103 remains over the contact 102. Pinhole defects in the adhesion layer 104 offer an opportunity for gold to diffuse into the underlying contact. If a pinhole or other defect in the adhesion layer 104 is present then the gold will be physically touching the underlying contact material 102.

The eutectic melting point of gold and silicon, approximately 385° C., is the temperature at which gold that is touching the underlying silicon contact will actually start to melt. If gold melts into this contact, then gold diffuses into the silicon device substrate, and a fabrication error occurs resulting in a manufacturing failure. As mentioned above, an adhesion layer, also called a barrier layer, between the gold layer and the underlying substrate or contact is normally used to prevent this from occurring, but these layers can have pinhole defects. Gold can diffuse through a pinhole defect into an underlying contact or into the substrate. Furthermore, this failure mode is avoided in more typical wafer processing by making sure that the wafer never rises above the gold-silicon eutectic temperature (i.e. approximately 377-385° C.)

In MEMS processing, a silicon (Si) wafer is commonly used as a device substrate. A handler substrate is frequently required for mechanical isolation or other reasons well known to those familiar with MEMS processing. This handler substrate is often a Si wafer or a glass wafer. A number of techniques can be used to bond the device substrate to the handler substrate. Three of those techniques are anodic bonding, glass frit bonding, and eutectic bonding.

In anodic bonding, the substrates can be bonded from approximately 300° C. up to nearly 500° C. by placing and clamping the substrates between two metal electrodes. A high direct current (DC) potential is applied between the electrodes creating an electrical field, which penetrates the substrates. If the handler substrate is a glass that contains sodium ions then at the elevated temperature the sodium ions are displaced from the bonding surface of the glass by the applied electrical field. The depletion of sodium ions near the surface of the glass makes the surface highly reactive with the silicon surface of the device substrate. The high reactivity results in a solid chemical bond between the two substrates.

In glass frit bonding, a viscous glass material is coated on one or both of the wafers to be bonded. This frit is sometimes heat treated to drive off solvents and binders. The wafers are then aligned if necessary and brought together. The wafers are then clamped under pressure and heated to temperatures that are typically in the range of 400° C. to 550° C. The glass frit flows and bonds to the two surfaces.

In eutectic bonding one substrate is coated with a first component of a two component eutectic bonding system and the other substrate is coated with the second component. The substrates are heated and brought into contact. Diffusion occurs at the interface and an alloy is formed. The eutectic composition alloy at the interface has a lower melting point than the materials on either side of it, and hence the melting is restricted to a thin layer. It is this melted eutectic layer that forms the bond.

All of these wafer bonding techniques use temperatures that are above the gold-silicon eutectic, but are not so high that the fabricated circuit would be ruined or destroyed. FIG. 8, labeled as "prior art" illustrates a device substrate 101 and a handler substrate 801 that are bonded together by a bond 802.

Aspects of the embodiments directly address the shortcomings of the prior art by patterning the gold layer 105 such that it does not overlay the contact 102.

BRIEF SUMMARY

It is therefore an aspect of the embodiments to select a device substrate and to process the device substrate using Micro-Electro-Mechanical Systems (MEMS) processing techniques up to the step of forming a contact. More than one contact can be formed. The contact is made from an electrically conductive material such as platinum silicide. Furthermore, contact formation often includes removing an insulating layer, such as an oxide layer or nitride layer, where it overlies any area where a contact is desired.

It is a further aspect of the embodiments to deposit an adhesion layer and then a gold layer over the device substrate. A refractory metal such as tungsten or tantalum can be used as an adhesion layer. Titanium tungsten (TiW) is a well known and commonly used material that can also be used as an adhesion layer.

It is another aspect of the embodiments to pattern the gold layer and the adhesion layer because both of those layers are electrically conducting. Failure to pattern the layers would result in all the contacts being electrically connected to one another. Furthermore, the gold layer is removed from the contact area so that subsequent high temperatures do not result in the diffusion of gold into the contact.

It is an aspect of certain embodiments to bond the device substrate to a handler substrate after the gold layer and the adhesion layer are patterned. Many bonding process require temperatures above 385° C. Anodic bonding, glass frit bonding, and eutectic bonding are examples of the bonding processes that can be used to bond the two substrates together. Properly patterning the gold layer in accordance with the embodiments disclosed here can ensure that gold doesn't diffuse into the contact.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
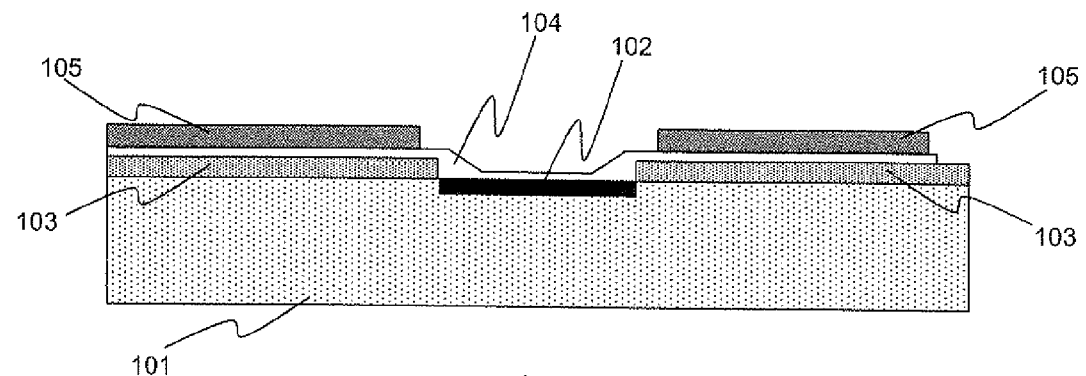
FIG. 1 illustrates a device substrate with a contact, passivation layer, adhesion layer, and gold layer after patterning.
Figure 6:
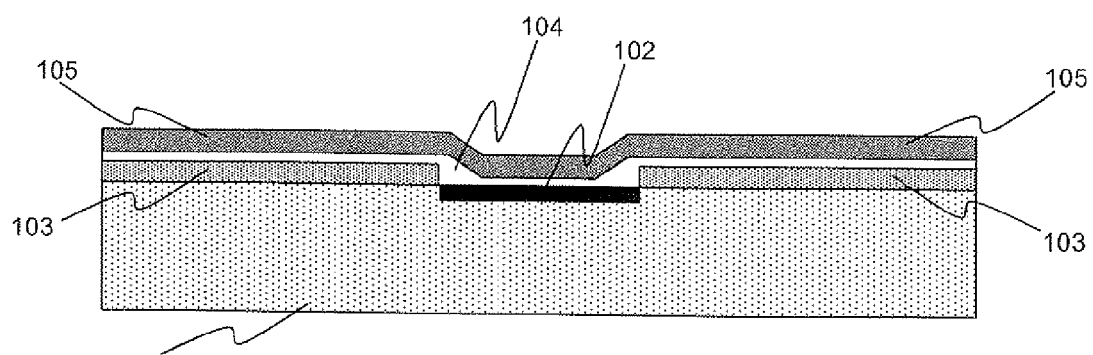
FIG. 6, labeled as "prior art", illustrates a device substrate with a contact, passivation layer, adhesion layer, and gold layer.
Figure 7:
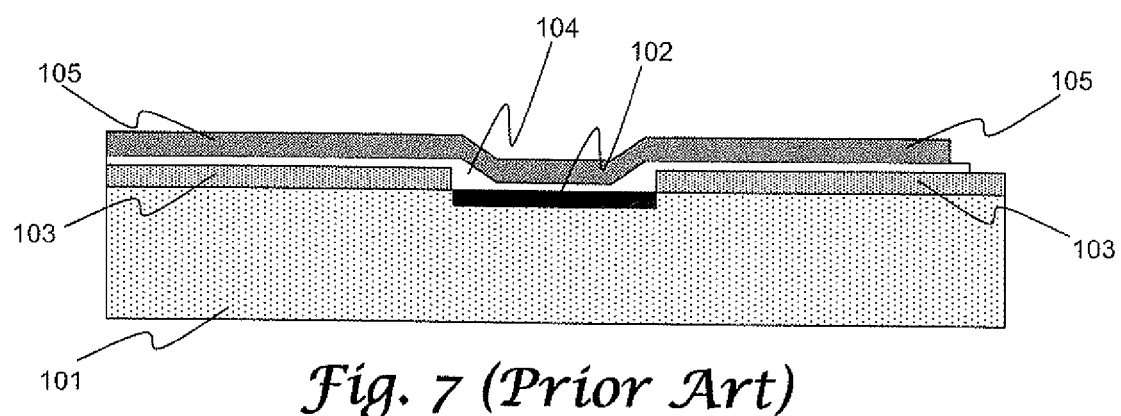
FIG. 7, labeled as "prior art", illustrates a device substrate with a contact, passivation layer, adhesion layer, and gold layer after patterning.
Figure 8:
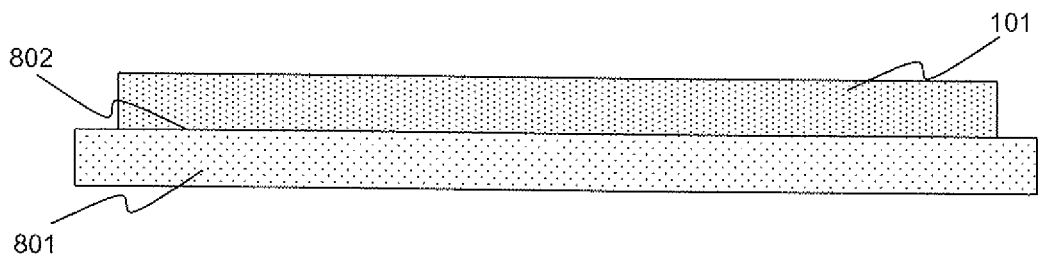
FIG. 8, labeled as "prior art" illustrates a device substrate and a handler substrate that are bonded together by a bond.

FIG. 1 illustrates a device substrate 101 with a contact 102, passivation layer 103, adhesion layer 104, and gold layer 105 after patterning. Comparing the structures illustrated in FIGS. 1 and 6, notice that in FIG. 1 there is no gold above the contact 102. One skilled in the art of Micro-Electro-Mechanical Systems (MEMS) processing is familiar with the techniques for producing the FIG. 7 structure. On consideration of the aspects of the embodiments disclosed herein, one skilled in the art of MEMS processing can use techniques to produce the structure illustrated in FIG. 1.

Figure 2:
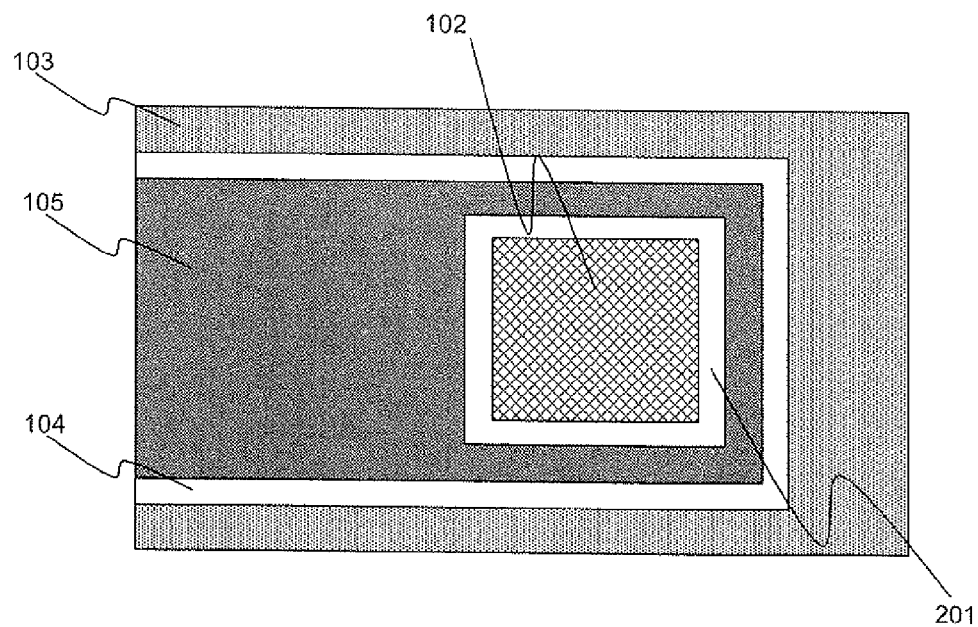
FIG. 2 illustrates a top view of a device substrate with a contact area, patterned passivation layer, patterned adhesion layer, and patterned gold layer.

FIG. 2 illustrates a top view of a device substrate 101 with a contact area 201, patterned passivation layer 103, patterned adhesion layer 104, and patterned gold layer 105. FIG. 1 is a side view of a structure and FIG. 2 is a top view of the same structure. The opening 201 is slightly larger than the contact 102 because there must not be any gold above the contact. This is accomplished by the design of the photomasks used for patterning the metal layers 104 and 105 which is well known to those skilled in the art. The manufacturing tolerances of MEMS processes cause the contact area, which is devoid of gold, to be slightly larger than the contact 102. Furthermore, there must not be gold close enough to the contact that gold can diffuse through pinhole defects in the adhesion layer and into the contact. FIG. 2 shows the contact 102 even though it lies underneath the adhesion layer 104 because the adhesion layer can be thin enough that underlying contact is visible.

Figure 3:
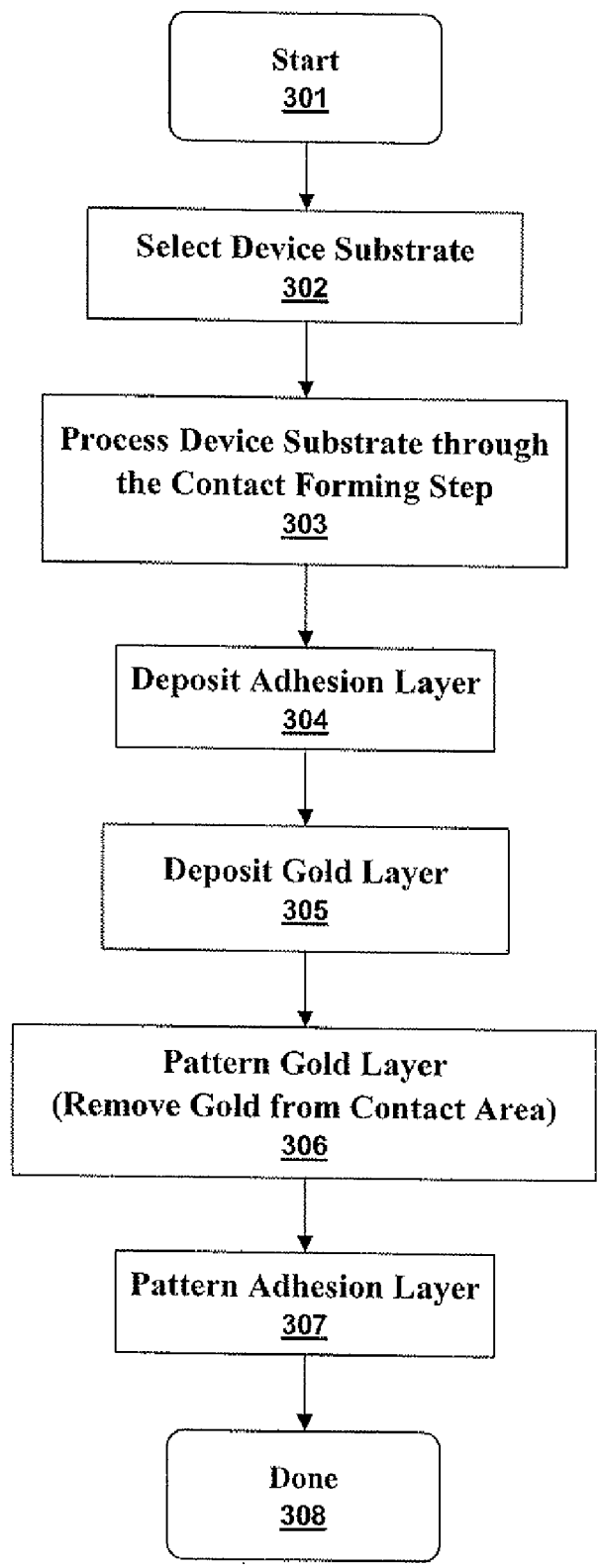
FIG. 3 illustrates a high level flow diagram for producing a device substrate with a contact area, patterned passivation layer, patterned adhesion layer, and patterned gold layer.
Figure 4:
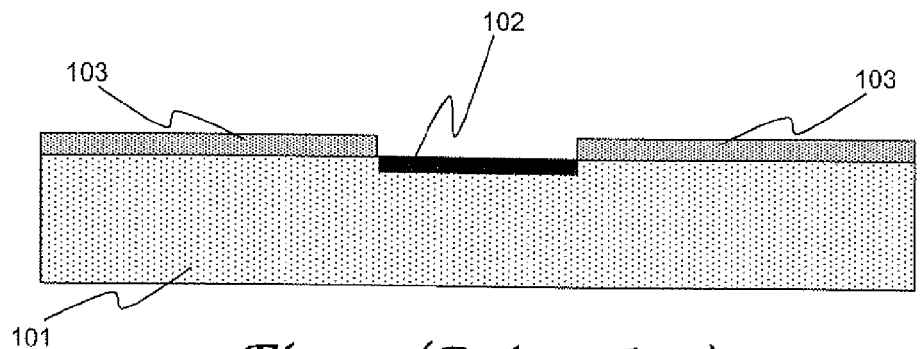
FIG. 4, labeled as "prior art", illustrates a device substrate with a passivation layer and a contact.
Figure 5:
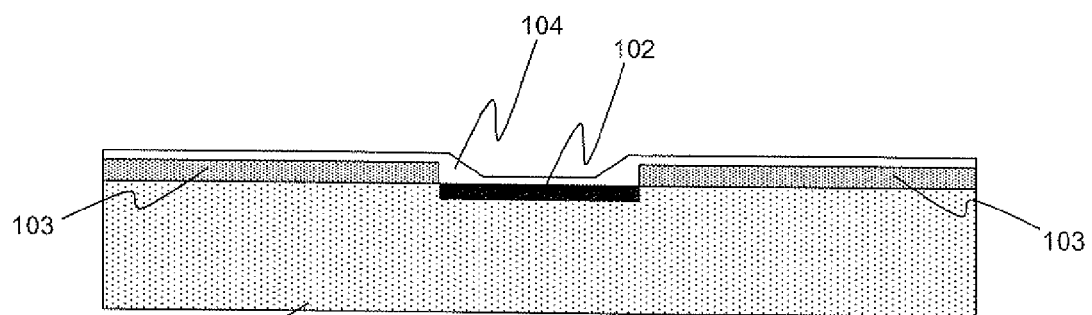
FIG. 5, labeled as "prior art", illustrates a device substrate with a contact, passivation layer, and an adhesion layer.

FIG. 3 illustrates a high level flow diagram for producing a device substrate 101 with a opening 201, patterned passivation layer 103, patterned adhesion layer 104, and patterned gold layer 105. After the start 301, a device substrate is selected 302 and processed up through contact formation 303. Next, an adhesion layer is deposited 304 and a gold layer is deposited 305. The gold layer is patterned 306 followed by patterning the adhesion layer 307. Patterning the gold layer includes removing the gold from the opening 201 after which the process is done 308 or further processing can be accomplished in the typical fashion. At this point, a device substrate that can withstand elevated temperatures without gold diffusing into the contact or substrate has been produced. Further processing at elevated temperatures, such as bonding the device substrate to a handler substrate, can now be safely performed.

It will be appreciated by those familiar with semiconductor processes that even though there is no gold above the contact area, there is still good electrical contact between the gold interconnect metal 105 and the contact 102 (typically platinum silicide as mentioned earlier). This accomplished through the adhesion metal layer 104 because the adhesion layer is also an electrically conductive metal. In other words, the gold layer 105 is electrically connected to the adhesion layer 104 which in turn is electrically connected to the contact 102.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A system comprising:
    a device substrate on which at least one device and at least one contact has been created via semiconductor processing, wherein the at least one contact comprises a contact material;
    an adhesion layer deposited over the contact and a contact area, wherein the contact area is an area around the contact; and
    a gold layer that overlays the adhesion layer in at least some areas but does not overlay the adhesion layer in the contact area such that exposure to temperatures between 375° C. and 550° C. does not result in gold contamination of the contact.

2. The system of claim 1 wherein the contact comprises platinum silicide.

3. The system of claim 1 wherein the adhesion layer comprises titanium tungsten.

4. A system comprising:
    a device substrate on which at least one device and at least one contact has been created via semiconductor processing wherein the at least one contact comprises a contact material;
    an adhesion layer deposited over the contact and a contact area, wherein the contact area is an area around the contact;
    a gold layer that overlays the adhesion layer in at least some areas but does not overlay the adhesion layer in the contact area such that exposure to temperatures between 375° C. and 550° C. does not result in gold contamination of the contact;
    a handler substrate; and
    a bond that adheres the handler substrate to the device substrate.

5. The system of claim 4 wherein the bond is an anodic bond.

6. The system of claim 4 wherein the bond is a glass frit bond.

7. The system of claim 4 wherein the bond is a eutectic bond.

8. The system of claim 4 wherein the contact comprises platinum silicide.

9. The system of claim 4 wherein the adhesion layer comprises titanium tungsten.

10. A system comprising:
    a device substrate on which at least one device and at least one contact has been created via semiconductor processing wherein the at least one contact comprises a contact material;
    an adhesion layer deposited over the contact and a contact area, wherein the contact area is an area around the contact;
    a gold layer that overlays the adhesion layer in most areas but does not overlay the adhesion layer in the contact area such that exposure to temperatures between 375° C. and 550° C. does not result in gold contamination of the contact;
    a handler substrate wherein the handler substrate is glass or silicon; and
    a bond that adheres the handler substrate to the device substrate.

11. The system of claim 10 wherein the bond is an anodic bond.

12. The system of claim 10 wherein the bond is a glass frit bond.

13. The system of claim 10 wherein the bond is a eutectic bond.

14. The system of claim 10 wherein the contact comprises platinum silicide.

15. The system of claim 10 wherein the adhesion layer comprises titanium tungsten.

16. The system of claim 10 wherein the contact comprises platinum silicide and the adhesion layer comprises titanium tungsten.

17. The system of claim 16 wherein the bond is an anodic bond.

18. The system of claim 16 wherein the bond is a glass frit bond.

19. The system of claim 16 wherein the bond is a eutectic bond.

* * * * *